United States Patent
Xu et al.

[11] Patent Number: 6,111,361
[45] Date of Patent: Aug. 29, 2000

[54] LIGHT EMITTING APPARATUS AND METHOD OF FABRICATION

[75] Inventors: Ji-Hai Xu, Gilbert; Franky So, Tempe, both of Ariz.; Hsing-Chung Lee, Calabasas, Calif.

[73] Assignee: Motorola, Inc., Schaumburg, Ill.

[21] Appl. No.: 09/151,347

[22] Filed: Sep. 11, 1998

[51] Int. Cl.$^7$ ........................................................ G09G 3/10
[52] U.S. Cl. ................................... 315/169.1; 315/169.3; 257/40; 257/88; 257/89; 257/98
[58] Field of Search ............................. 315/169.1, 169.3; 257/40, 79, 80, 83, 84, 88, 89, 98, 101, 102, 103; 313/498, 499, 500, 501

[56] References Cited

U.S. PATENT DOCUMENTS

| | | | |
|---|---|---|---|
| 5,223,723 | 6/1993 | Luryi | 257/184 |
| 5,929,474 | 7/1999 | Huang et al. | 257/83 |
| 5,986,286 | 11/1999 | Yamazaki et al. | 257/65 |
| 5,998,803 | 12/1999 | Forrest et al. | 257/103 |
| 5,998,805 | 12/1999 | Shi et al. | 257/40 |
| 6,008,588 | 12/1999 | Fujii | 315/169.1 |

*Primary Examiner*—Don Wong
*Assistant Examiner*—Thuy Vinh Tran
*Attorney, Agent, or Firm*—Eugene S. Parsons; William E. Koch

[57] ABSTRACT

Light emitting apparatus comprising a thin film transistor having a current carrying terminal, an organic electroluminescent device for emitting light having a broad spectrum and having a first terminal connected to current carrying terminal, a color converting medium for absorbing light coupled thereto and emitting light in response to absorbed light, and a microcavity coupling emitted light from the organic electroluminescent device to the color converting medium.

14 Claims, 1 Drawing Sheet

LIGHT EMITTING APPARATUS AND METHOD OF FABRICATION

FIELD OF THE INVENTION

The present invention pertains to electroluminescent devices and more specifically to thin-film-transistor organic electroluminescent devices.

BACKGROUND OF THE INVENTION

Advances in flat panel displays (FPD) technology have made high quality, large area, full color high-resolution displays possible. Currently, liquid crystal displays (LCD) are the display of choice. A major drawback to LCD panels is their poor performance in low ambient light conditions. For example, reflective LCDs can only be used in high ambient light conditions because they derive their light from the ambient light, i.e. the ambient light is reflected by the LCDs. Some transflective LCDs are designed to operate in a transmissive mode and incorporate a backlighting arrangement for use when ambient light is insufficient. In addition, transflective displays have a certain visual aspect and some users prefer a bright emissive display. However, these types of displays are generally too large for practical use in very small devices, such as portable electronic devices and consume considerable power which adversely affects portable display applications.

Organic electroluminescent device (OED) arrays are emerging as a potentially viable design choice for use in small products, especially small portable electronic devices such as pagers, cellular and portable telephones, two-way radios, data banks, etc. OED arrays are capable of generating sufficient light for use in displays under a variety of ambient light conditions (from little or no ambient light to bright ambient light). Further, OEDs can be fabricated relatively cheaply and in a variety of sizes from very small (less than a tenth millimeter in diameter) to relatively large (greater than an inch) so that OED arrays can be fabricated in a variety of sizes. Also, OEDs have the added advantage that their emissive operation provides a very wide viewing angle.

A drawback with OED devices are that they are difficult to drive using simple two-terminal schemes because of their lack of memory. The rise and decay time of an OED is very fast and it does not have intrinsic memory. To overcome this problem, four terminal thin-film-transistor (TFT) devices have been developed to drive OED devices. These devices include two TFTs, a storage capacitor and an OED pad arranged on a substrate. The storage capacitor enables the excitation power to an addressed EL element to stay on once it is selected.

While successfully overcoming the above-mentioned problem, the storage capacitor process and deposition are very complicated and difficult to achieve in a fabrication process. In these devices, a capacitor is formed by the gate electrode, acting as the bottom electrode of the capacitor, separated from an overlying top electrode by a gate oxide-insulating layer. The top electrode is connected to the source region. An example of this structure can be seen in European Patent Office Publication No. EP O 717,445 A2, published Jun. 19, 1996. Several problems are apparent in this type of device, namely, the process is complicated and leakage is possible due to the sharp edge at the anode of the OED formed by the capacitor process.

Another problem in the use of OEDs in displays is the generation of the colors necessary to achieve a full color display. Red, green and blue OEDs can be fabricated but they require different organic materials and, thus, each color must be fabricated separately. Furthermore, the colors achieved are not a pure primary color, but have a relatively broad spectrum. Emission of red light is very difficult to achieve in OEDs however, it is known to convert other colors, such as blue light, to red light. One such technique is disclosed in Japanese Publication, Kokai Patent No. Hei 8-286033 entitled "Red Emitting Device Using Red Fluorescent Converting Film", published Nov. 1, 1996. While converting blue light to red light, the efficiency of the conversion is unacceptably low, and the red light contains unacceptable levels of blue green components.

Accordingly, it is highly desirable to provide a new and improved light emitting apparatus and method of fabrication.

It is another purpose of the present invention to provide a new and improved light emitting apparatus with enhanced performance.

It is a further object of the present invention to provide a new and improved method of fabricating a light emitting apparatus with a simplified process.

It is yet another object of the present invention to provide a light emitting apparatus with a capacitor, and method of fabrication.

SUMMARY OF THE INVENTION

The above problems and others are at least partially solved and the above purposes and others are realized in a light emitting apparatus including a thin film transistor, a microcavity and a color converting medium. The thin film transistor includes a current carrying terminal. The organic electroluminescent device emits light having a broad spectrum and includes a first terminal connected to current carrying terminal. The color converting medium absorbs light coupled thereto and emits light in response to absorbed light. The microcavity couples emitted light from the organic electroluminescent device to the color converting medium.

Also provided is a method of fabricating a light emitting apparatus including a thin film transistor, a microcavity and a color converting medium.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENT

Figure 1:
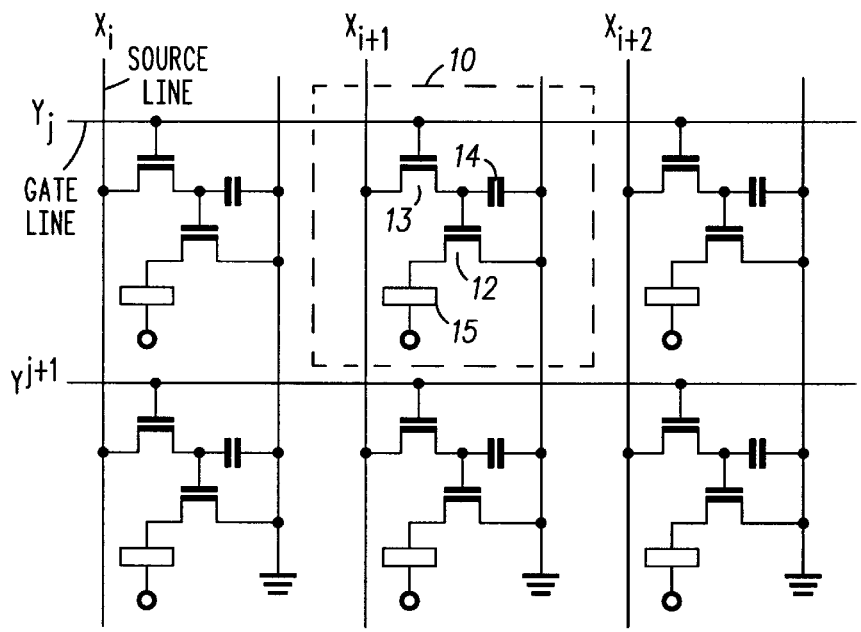
FIG. 1 is a schematic diagram of an active matrix 4-terminal light emitting apparatus.

Turning now to the drawings in which like reference characters indicate corresponding elements throughout the several views, attention is first directed to FIG. 1 which illustrates the schematic of an active matrix 4-terminal display consisting of a plurality of light emitting apparatus forming addressable pixels. A light emitting apparatus 10, indicated by broken lines, includes a power TFT 12, an addressable TFT 13, a storage capacitor 14 and an OED element 15. The major advantage of the 4-terminal scheme is the ability to decouple the addressing signal from the OED excitation signal. OED elements are selected via the addressable TFTs and the excitation power to the OED element is controlled by the power TFT. The storage capacitors enable the excitation power to an addressed OED element to stay on once it is selected. Thus, the circuit provides a memory that allows the OED element to operate at a duty cycle of close to 100%, regardless of the time allotted for addressing.

Figure 2:
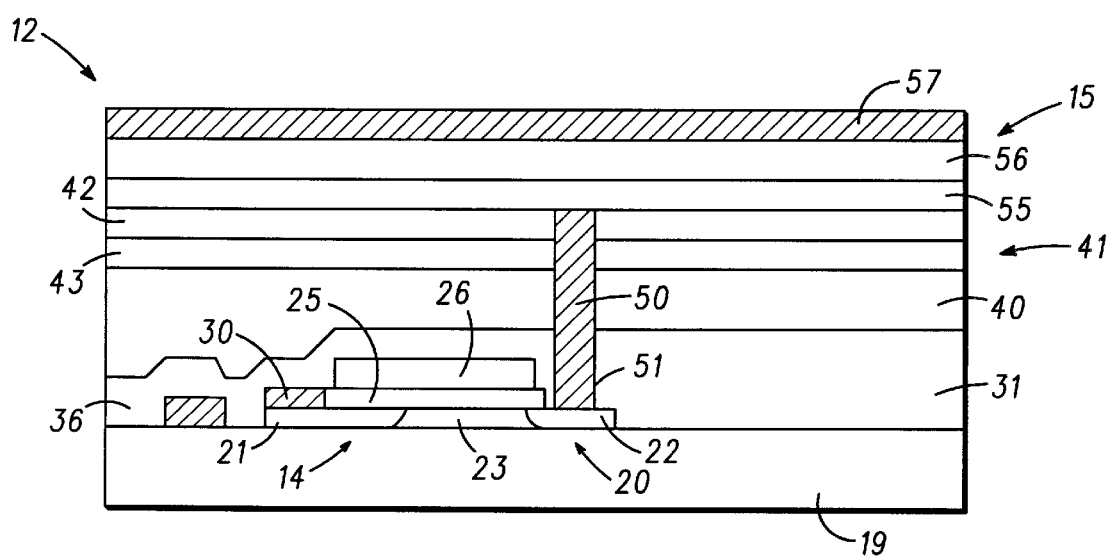
FIG. 2 is a simplified sectional view of a light emitting apparatus according to the present invention.

Turning now to FIG. 2, a simplified cross sectional view of light emitting apparatus 10 is illustrated. Light emitting apparatus 10 includes power TFT 12, addressable TFT 13, storage capacitor 14 and OED element 15. Power TFT 12 includes a semiconductive layer 20 positioned on a transparent insulating substrate 19, such as glass, or the like. First and second spaced apart doped regions 21 and 22 are formed in semiconductive layer 20 by some convenient method, such as implanting, diffusion, or the like. N+ type doping is preferred to permit easy integration with standard semiconductor circuitry. Doped regions 21 and 22 define first and second current carrying terminals (e.g. source and drain) with a channel 23 therebetween. The first and second current carrying terminals will hereinafter be referred to as source and drain.

An insulating layer 25 is positioned on semiconductor layer 20 overlying channel 23 and is preferably formed of $SiO_2$ or other oxides, nitrides or the like. A semiconductor layer 26, heavily doped (preferably n+) for good conduction is positioned on insulating layer 25. A portion of semiconductor layer 26 overlying channel 23 forms a control terminal (e.g. a gate), and a left most portion of semiconductor layer 26, as seen in FIG. 2, overlies a portion of doped region 21. Capacitor 14 is defined by the overlying portions of semiconductor layer 26 and doped region 21. The overlap is achieved by positioning channel 23 off center to the right as seen with reference to FIG. 2, within layer 20. Generally, doped region 21 is formed larger than doped region 22 to provide this offset. This unique placement of capacitor 14 reduces processing steps and space requirements, as well as connecting capacitor 14 between the control terminal (e.g. gate) and the source. The capacitance of capacitor 14 can be easily controlled by changing the area of doped area 21, i.e. the source terminal. The processing steps are reduced because no additional layers are added. A re-apportionment of existing layers produces capacitor 14.

Contact metal 30 is positioned on doped region 21 and operates as an external electrical contact to the source terminal formed by doped region 21. With additional reference to FIG. 1, contact metal 30 extends to adjacent power TFTs in the same column and connects all source terminals formed by doped regions 21 to ground.

A layer 31 of $SiO_2$ is deposited on the surface of substrate 19 adjacent power TFT 12 to aid in the formation of OED 15. It should be understood that layer 31 is optional, depending upon the formation of substrate 19, and is considered a portion of substrate 19 for purposes of this disclosure. Then a passivation layer 36 of an insulating material such as SiO2 is deposited over the surface of TFT 12.

A color converting medium (CCM) 40 is deposited and planarized on the surface of the passivation layer 36 and on the surface of the layer 31 of $SiO_2$. A microcavity 41 is then processed on the surface of CCM 40. Microcavity 41 includes a spacer 42 and a dielectric stack 43. Dielectric stack 43 includes a plurality of layers of material having different indexes of refraction. The plurality of layers is divided into pairs of layers, one layer of each pair having a first index of refraction and another layer of each pair having a second index of refraction lower than the first index of refraction with each pair of layers cooperating to form a partial mirror and to reflect light. The plurality of layers can be formed from a variety of materials including various semi-transparent metals and various dielectrics. In a typical example, dielectric stack 43 is preferably formed of, for example, alternate layers of $TiO_2$ and $SiO_2$. Generally, from 2 to 4 pairs of layers provides a reflectivity of approximately 0.74, which is believed to be optimal for the present purpose. As is understood by those skilled in the art, each pair of layers of dielectric stack 21 defines a partial mirror with an operating thickness of an integer multiple of one half wavelength of the emitted light so that all reflected light is in phase.

A bore or hole 50 is then drilled through spacer 42, dielectric stack 43, CCM 40, passivation layer 36 and layer 31 to drain terminal 22 into which is placed a metal contact 51. OED 15 is then processed on the surface of spacer 42. OED 15 includes a first terminal 55 connected to the drain terminal 22 via metal contact 51. First terminal 55 is formed by depositing a transparent conductive layer, such as ITO or other transparent conductors, on microcavity 41 in electrical communication with doped region 22 to communicate the OED light output to the remainder of apparatus 10. At least one organic electroluminescent layer 56 is deposited on first terminal 55. A conductive layer 57 defining a second terminal is deposited overlying organic electroluminescent layer 56. Conductive layer 57 provides an external electrical contact for the application of power to OED 15. Conductive layer 57 also provides passivation for the entire structure. Microcavity 41 is positioned in alignment with the light output from OED 15 to enhance the light spectrum. It will of course be understood that OED 15 could include from one organic layer to several, depending upon the material utilized.

While addressing TFT 13 is not illustrated in FIG. 2, it will be understood that it can be integrated in a variety of techniques and positions not material to the present invention.

Recently it has been demonstrated (see Japanese publication cited above) that efficient RGB light emission can be achieved by combining an organic OED emitter for emitting one of either blue or blue-green organic light with a CCM device, such as CCM 40. In the case of OED 15 being provided as a blue organic light emitter, CCM 40 is made up of organic fluorescent media, such as a blue-color filter and green and red CCMs, which change the color of emitted light from blue to form a full a RGB full color display. The TET drives can enhance the electroluminescent reliability because it operates at a low current density (1 ma/cm$^2$). The effect of microcavity 41 is to enhance and purify the blue light from OED 15. Such an enhanced and purified blue light output from microcavity 41 passes through the blue color filter of CCM 40 to give rise to the blue-light output. In order to obtain the green light output, the green CCM of CCM 40 absorbs blue light and emits green light. To obtain the red color, the red CCM pixels are needed. The red CCM of CCM 40 can absorb blue light and emit green light. Then the green light is re-absorbed and re-emitted in the form of red light output.

In the case of OED 15 being provided as a blue-green organic light emitter, CCM 40 is made up of organic fluorescent media, such as blue and green color filters and a red CCM, which change the color of emitted light from blue-green to form a full a RGB full color display. As indicated above, the TFT drives can enhance the electroluminescent reliability because it operates at a low current density (1 ma/cm$^2$). The effect of microcavity 41 is to enhance and purify the blue-green light from OED 15. Such an enhanced and purified blue-green light output from microcavity 41 passes through the blue and green color filters of CCM 40 to give rise to the blue and green-light output, respectively. In order to obtain the red light output, the red CCM of CCM 40 absorbs blue and green light and emits the red light. To obtain the red color, the red CCM pixels are needed.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. Light emitting apparatus comprising:
    a thin film transistor having a current carrying terminal;
    an organic electroluminescent device for emitting light having a broad spectrum and having a first terminal connected to current carrying terminal;
    a color converting medium for absorbing light coupled thereto and emitting light in response to absorbed light; and
    a microcavity coupling emitted light from the organic electroluminescent device to the color converting medium.

2. Organic electroluminescent apparatus as claimed in claim 1 wherein the organic electroluminescent device is constructed to emit light in a blue-green spectrum.

3. Organic electroluminescent apparatus as claimed in claim 2 wherein the color converting medium includes a blue color filter, a green color filter and a red color converting medium.

4. Organic electroluminescent apparatus as claimed in claim 1 wherein the organic electroluminescent device is constructed to emit light in a blue spectrum.

5. Organic electroluminescent apparatus as claimed in claim 4 wherein the color converting medium includes a blue color filter, a green color converting medium and a red color converting medium.

6. Light emitting apparatus including an active matrix comprising:
    a plurality of addressable pixels formed on a substrate;
    each pixel including;
        a thin film transistor having a current carrying terminal;
        an organic electroluminescent device for emitting light having a broad spectrum and having a first terminal connected to current carrying terminal;
        a color converting medium for absorbing light coupled thereto and emitting light in response to absorbed light; and
        a microcavity coupling emitted light from the organic electroluminescent device to the color converting medium.

7. Organic electroluminescent apparatus as claimed in claim 6 wherein the organic electroluminescent device is constructed to emit light in a blue-green spectrum.

8. Organic electroluminescent apparatus as claimed in claim 7 wherein the color converting medium includes a blue color filter, a green color filter and a red color converting medium.

9. Organic electroluminescent apparatus as claimed in claim 6 wherein the organic electroluminescent device is constructed to emit light in a blue spectrum.

10. Organic electroluminescent apparatus as claimed in claim 9 wherein the color converting medium includes a blue color filter, a green color converting medium and a red color converting medium.

11. A method of fabricating a light emitting apparatus comprising the steps of:
    providing a substrate;
    depositing a thin film transistor on the substrate, the thin film transistor having a current carrying terminal;
    forming color converting medium overlying the thin film transistor;
    depositing a microcavity on the color converting medium; and
    forming an organic electroluminescent device on the microcavity in electrical communication with the current carrying terminal.

12. A method as claimed in claim 11 wherein the step of forming an organic electroluminescent device includes the steps of:
    forming a hole through the microcavity and the color converting medium and depositing a metal contact in the hole in electrical communication with the second current carrying terminal;
    depositing a first terminal on the microcavity in electrical communication with the metal contact;
    depositing at least one organic electroluminescent layer on the first terminal; and
    depositing a conductive layer overlying the at least one organic electroluminescent layer.

13. A method of fabricating light emitting apparatus including an active matrix with a plurality of addressable pixels comprising the steps of:
    providing a substrate;
    forming each pixel by:
        depositing a thin film transistor on the substrate, the thin film transistor having a current carrying terminal;
        forming color converting medium overlying the thin film transistor;
        depositing a microcavity on the color converting medium; and
        forming an organic electroluminescent device on the microcavity in electrical communication with the current carrying terminal.

14. A method as claimed in claim 13 wherein the step of forming an organic electroluminescent device includes the steps of:
    forming a hole through the microcavity and the color converting medium and depositing a metal contact in the hole in electrical communication with the second current carrying terminal;
    depositing a first terminal on the microcavity in electrical communication with the metal contact;
    depositing at least one organic electroluminescent layer on the first terminal; and
    depositing a conductive layer overlying the at least one organic electroluminescent layer.

* * * * *